(12) United States Patent
Sugiyama

(10) Patent No.: US 8,461,665 B2
(45) Date of Patent: Jun. 11, 2013

(54) WAFER AND PACKAGE PRODUCT MANUFACTURING METHOD

(75) Inventor: Takeshi Sugiyama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 9 days.

(21) Appl. No.: 13/114,415

(22) Filed: May 24, 2011

(65) Prior Publication Data
US 2011/0220383 A1 Sep. 15, 2011

Related U.S. Application Data

(63) Continuation of application No. PCT/JP2008/073043, filed on Dec. 18, 2008.

(51) Int. Cl.
*H01L 29/06* (2006.01)

(52) U.S. Cl.
USPC ............ 257/618; 257/619; 257/620; 257/704

(58) Field of Classification Search
USPC .................. 257/618, 619, 620, 704; 438/458, 438/459, 113, 462; 174/50
See application file for complete search history.

(56) References Cited

U.S. PATENT DOCUMENTS

| | | | |
|---|---|---|---|
| 6,686,225 B2 * | 2/2004 | Wachtler | 438/114 |
| 6,955,976 B2 | 10/2005 | Hartwell et al. | |
| 7,859,084 B2 | 12/2010 | Utsumi et al. | |
| 2003/0102540 A1 | 6/2003 | Lee | |
| 2004/0219764 A1 | 11/2004 | Syllaios et al. | |
| 2005/0009299 A1 * | 1/2005 | Wada et al. | 438/459 |
| 2005/0009301 A1 | 1/2005 | Nagai et al. | |
| 2007/0155056 A1 | 7/2007 | Kang et al. | |
| 2009/0018035 A1 | 1/2009 | Lee et al. | |
| 2009/0197394 A1 | 8/2009 | Parekh | |
| 2010/0207698 A1 | 8/2010 | Tange | |
| 2010/0237740 A1 | 9/2010 | Aratake et al. | |
| 2011/0223363 A1 | 9/2011 | Sugiyama | |

FOREIGN PATENT DOCUMENTS

| | | |
|---|---|---|
| JP | 10-206458 A | 8/1998 |
| JP | 2000-077552 A | 3/2000 |
| JP | 2006-282480 A | 10/2006 |
| JP | 2006-339896 A | 12/2006 |
| JP | 2008-058005 A | 3/2008 |
| JP | 2010-124015 A | 6/2010 |
| WO | WO 2010/061470 A1 | 6/2010 |

OTHER PUBLICATIONS

English translation of Japanese Patent JP 2000-077552 by Hara Tetsuzo dated Mar. 14, 2000.*

(Continued)

*Primary Examiner* — Thinh T Nguyen
(74) *Attorney, Agent, or Firm* — Brinks Hofer Gilson & Lione

(57) ABSTRACT

A wafer is provided that is stacked on and anodically bonded to another wafer to form a plurality of package products each having a cavity in which an operation piece is contained between the wafers. The wafers has a product area in which a plurality of concave portions are formed each of which will be part of the cavity when stacked on the another wafer, and grooves or slits are formed extending from the central portion in radial direction to the outside in radial direction of the wafer and reaching the outside of the product area.

2 Claims, 13 Drawing Sheets

OTHER PUBLICATIONS

International Search Report for International Application No. PCT/JP2008/073043, dated Jan. 20, 2009, 1 page.
Office Action from co-pending U.S. Appl. No. 13/113,433, dated Sep. 5, 2012, 6 pages.
U.S. Appl. No. 13/113,433, filed May 23, 2011 in the United States Patent and Trademark Office.
U.S. Appl. No. 13/406,992, filed Feb. 28, 2012 in the United States Patent and Trademark Office.
U.S. Appl. No. 13/411,969, filed Mar. 5, 2012 in the United States Patent and Trademark Office.
Liu et al., "A New Approach to Fabricate Deep Cavities in Pyrex7740 Glass for Vacuum Packaging of Sensor," IEEE Sensors Conference, 2008, pp. 466-469.
Turner et al., "Modeling of direct wafer bonding: Effect of wafer bow and etch patterns," Journal of Applied Physics, vol. 92, No. 12, Dec. 15, 2002, pp. 7658-7666.
Office Action from co-pending U.S. Appl. No. 12/708,881, dated Aug. 1, 2012, 10 pages.
Office Action from co-pending U.S. Appl. No. 12/708,881, dated Jan. 2, 2013, 10 pages.
U.S. Appl. No. 12/708,881, filed Feb. 19, 2010 in the United States Patent and Trademark Office.
Office Action from co-pending U.S. Appl. No. 13/411,969, dated Mar. 15, 2013, 10 pages.
Office Action from co-pending U.S. Appl. No. 13/113,433, dated Mar. 5, 2013, 8 pages.

* cited by examiner

WAFER AND PACKAGE PRODUCT MANUFACTURING METHOD

RELATED APPLICATIONS

This application is a continuation of PCT/JP2008/073043 filed on Dec. 18, 2008. The entire content of this application is incorporated herein by reference.

BACKGROUND OF THE INVENTION

1. Field of the Invention

The present invention relates to a wafer and a package product manufacturing method.

2. Description of the Related Art

In recent years, package products have been widely used which include: a base substrate and a lid substrate that are stacked on and anodically bonded to each other with a cavity formed therebetween; and an operation piece mounted on a portion of the base substrate located in the cavity. One known example of this type of package product is a piezoelectric vibrator attached to a mobile phone or personal digital assistant, which utilizes a quartz or the like as a time source, timing source for control signal or the like, reference signal source or the like.

By the way, this package product is formed as follows, for example, as described in Patent Document 1 below.

First, a base substrate wafer and a lid substrate wafer are set in an anodic bonding apparatus placed in a vacuum chamber, then these wafers are stacked on each other with a bonding film for anodic bonding, of a conductive material, provided therebetween.

Here, on the bonding surface of the lid substrate wafer, a plurality of concave portions are formed each of which will be the cavity when the base substrate wafer is stacked thereon. On the other hand, on the bonding surface of the base substrate wafer, a plurality of operation pieces are mounted corresponding to the concave portions, and the bonding film is formed on the portion other than the portions in which the operation pieces are mounted. Further, the lid substrate wafer is set on a electrode plate of the anodic bonding apparatus.

Next, while the lid substrate wafer is being heated to activate ions contained therein, a voltage is applied between the bonding film and the electrode plate to cause a current to flow in the lid substrate wafer, thereby causing an electrochemical reaction in the interface between the bonding film and the bonding surface of the lid substrate wafer to anodically bond them, forming a bonded wafer body.

Then, this bonded wafer body is cut at predetermined locations to form a plurality of package products.
Patent Document 1: JP-A-2006-339896

Conventionally, however, when the above-described anodic bonding is performed, in the product area in which the concave portions (cavities) or operation pieces are placed, the outer circumference portions of the wafers tend to be bonded before the central portions are bonded. Then, oxygen gas generated between the wafers in this bonding may remain between the central portions to reduce the vacuum in the cavities of the package products obtained from the central portions, which may provide a package product lacking in desired performance.

In view of the above, it is an object of the present invention to provide a wafer and a package product manufacturing method in which oxygen gas generated between the two wafers when the wafers are bonded can be facilitated to be discharged to the outside.

SUMMARY OF THE INVENTION

The present invention provides a wafer that is stacked on and anodically bonded to another wafer to form a plurality of package products each having a cavity in which an operation piece is contained between the wafers, characterized in that the wafer has a product area in which a plurality of concave portions are formed each of which will be part of the cavity when stacked on the another wafer, and grooves or slits are formed extending from the central portion in radial direction to the outside in radial direction of the wafer and reaching the outside of the product area.

Furthermore, the invention provides a package product manufacturing method of stacking and anodically bonding two wafers to each other to form a plurality of package products each having a cavity in which an operation piece is contained between the wafers, characterized in that the wafers are those according to the invention.

According to the invention, since the grooves or slits are formed in the wafer, oxygen gas generated between the wafers when the wafers are bonded can be facilitated to be discharged from between the wafers to the outside through the grooves or slits, which can inhibit the formation of a package product having a low vacuum in the cavity.

Furthermore, since the grooves or slits are formed in the wafer including the concave portions, the grooves or slits can be formed together when the concave portions are formed by, for example, pressing or etching, which can improve the efficiency of forming this wafer.

Here, the outer edges in radial direction of the grooves or slits may be located inward in radial direction with respect to the outer circumference of the wafer.

In this case, since the outer edges in radial direction of the grooves or slits are located inward in radial direction with respect to the outer circumference of the wafer, the reduction in strength of the wafer due to forming the grooves or slits in the wafer can be inhibited, preventing the handling quality of the wafer from deteriorating.

Note that, in using such wafers, preferably, portions of the wafers located between the outer edges in radial direction of the grooves or slits and the outer circumferences of the wafers are not bonded to each other.

In this case, since the portions of the wafers located between the outer edges in radial direction of the grooves or slits and the outer circumferences of the wafers are not bonded to each other, the oxygen gas in the grooves or slits can be reliably discharged from between the wafers to the outside through the small gap between the portions of the wafers.

According to the wafer and the package product manufacturing method in accordance with the invention, the oxygen gas generated between the two wafers when the wafers are bonded can be facilitated to be discharged to the outside.

DETAILED DESCRIPTION OF THE PREFERRED EMBODIMENTS

Figure 1:
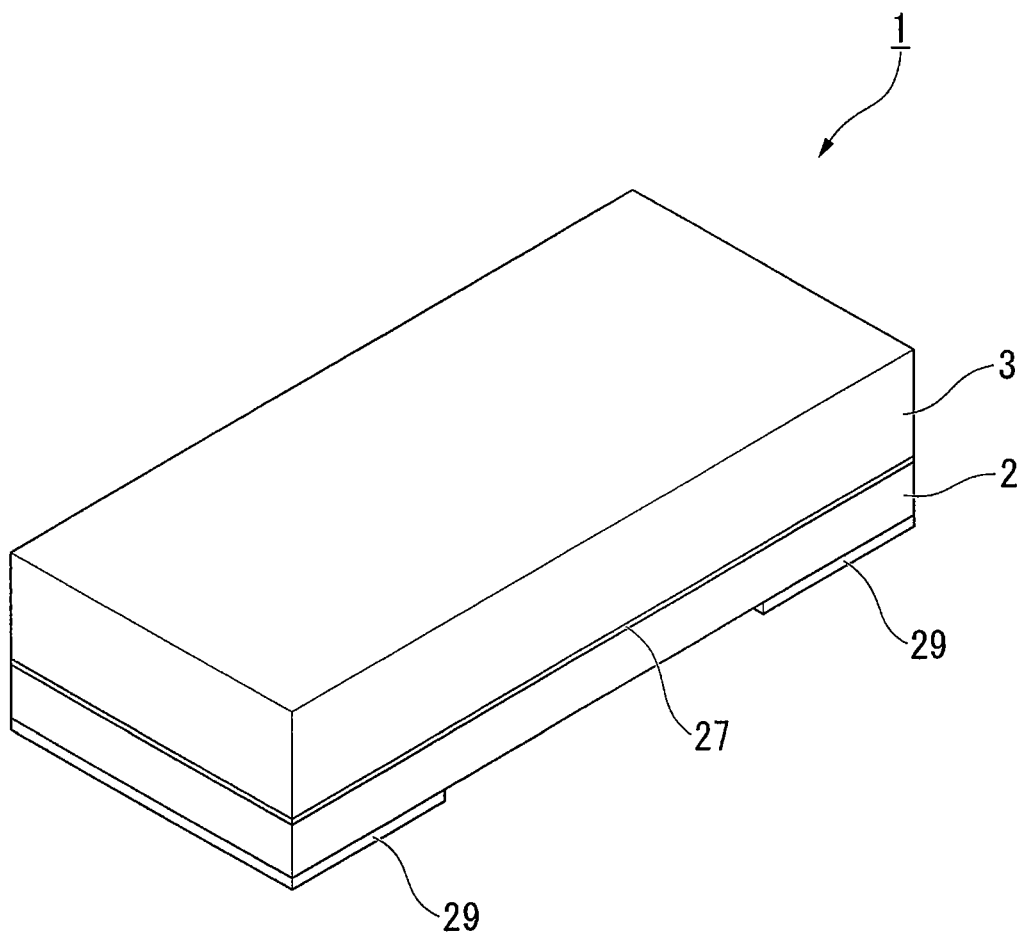
FIG. 1 shows an embodiment of the invention, which is an appearance perspective view of a piezoelectric vibrator.

An embodiment in accordance with the present invention is described below with reference to FIGS. 1 to 15.

In this embodiment, a piezoelectric vibrator is described as an example of a package product that includes: a base substrate and a lid substrate that are stacked on and anodically bonded to each other with a cavity formed therebetween; and an operation piece mounted on a portion of the base substrate located in the cavity.

As shown in FIGS. 1 to 5, a piezoelectric vibrator 1 is a surface mount device that is formed as a box of a base substrate 2 and a lid substrate 3 stacked on each other in two layers, in which a piezoelectric vibration piece (operation piece) 4 is contained in a cavity C. Note that, in FIG. 5, for viewability, excitation electrodes 13, pull-out electrodes 16, mount electrodes 14 and weight metallic films 17 (described later) are not shown.

Figure 6:
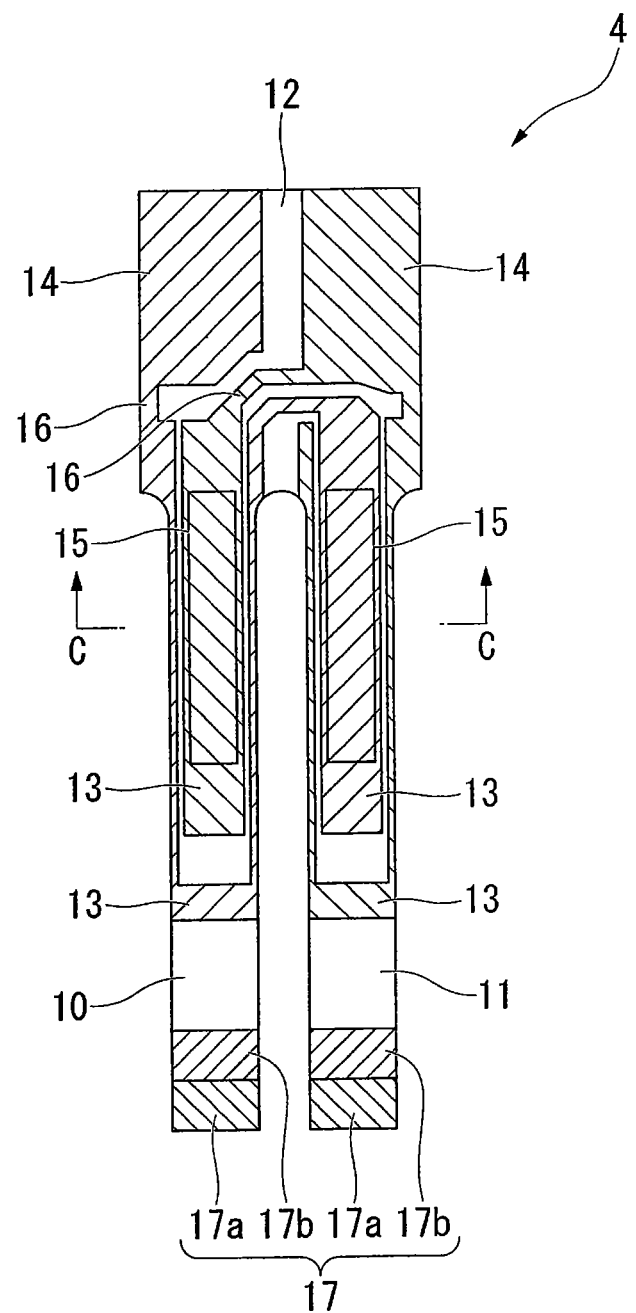
FIG. 6 is a top view of a piezoelectric vibration piece that is part of the piezoelectric vibrator shown in FIG. 1.
Figure 7:
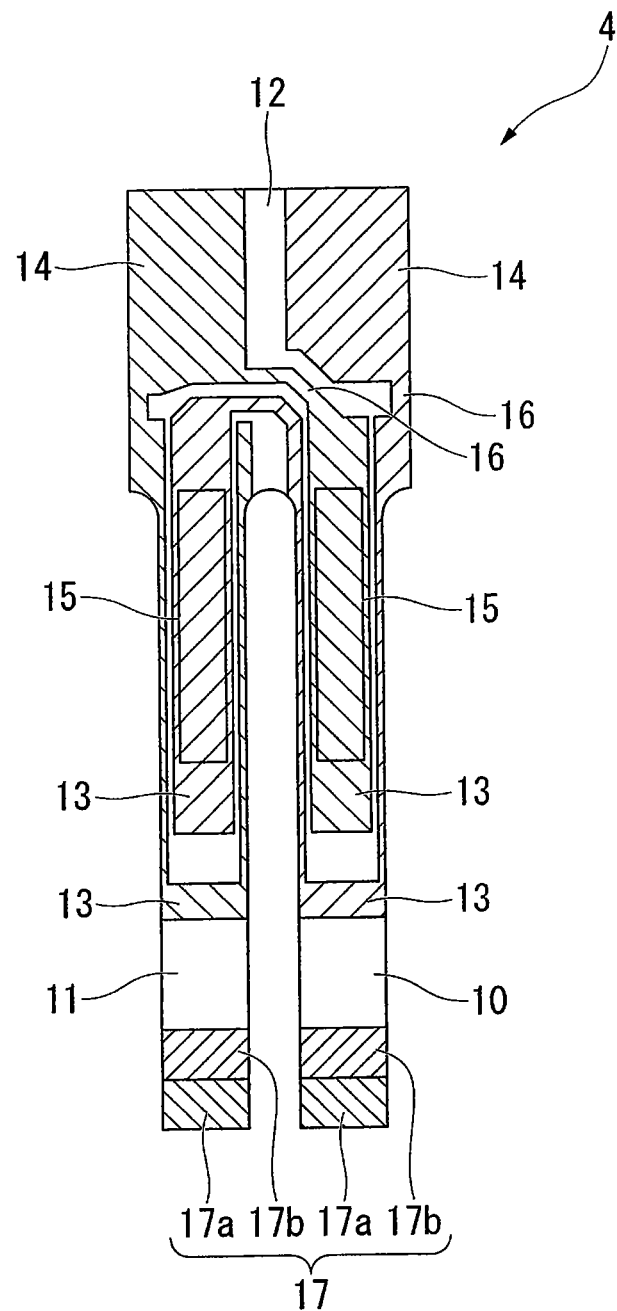
FIG. 7 is a bottom view of the piezoelectric vibration piece shown in FIG. 5.
Figure 8:
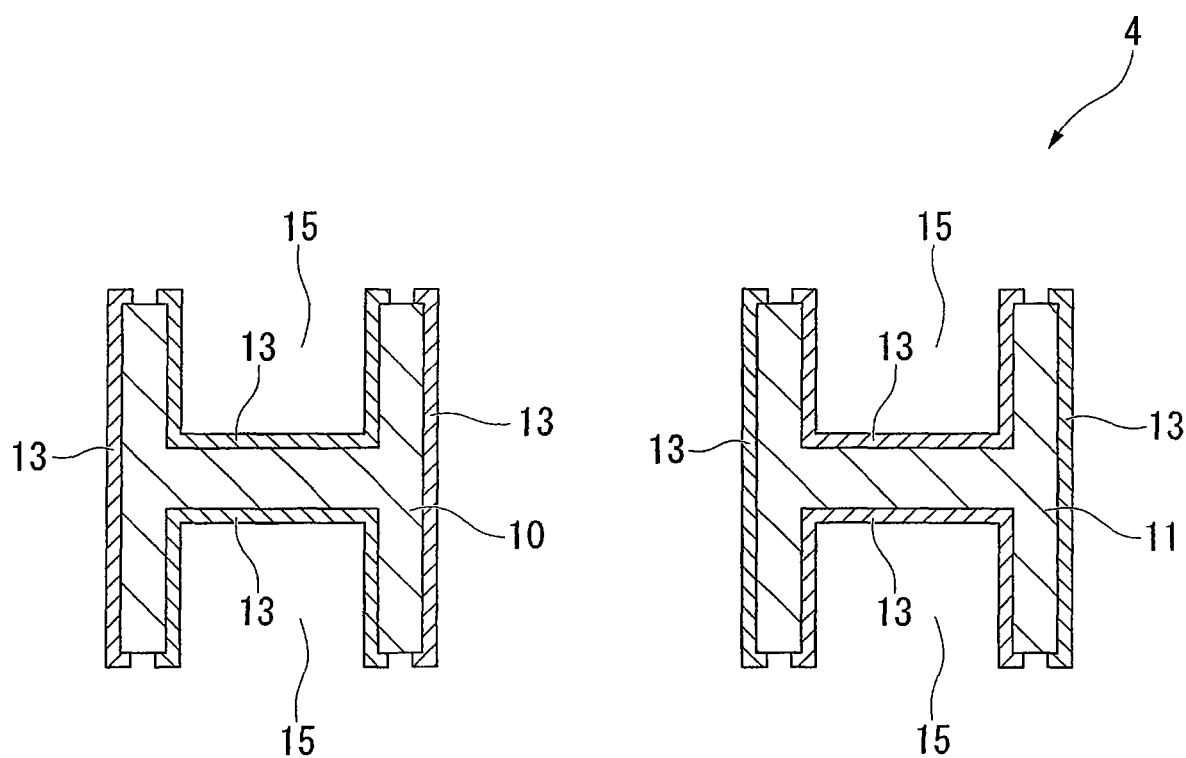
FIG. 8 is a cross-sectional view along the line C-C in FIG. 6.

As shown in FIGS. 6 to 8, the piezoelectric vibration piece 4 is a tuning fork-type vibration piece formed of a piezoelectric material, such as quartz, lithium tantalate or lithium niobate, that vibrates when a predetermined voltage is applied thereto.

The piezoelectric vibration piece 4 includes: a pair of vibration arms 10, 11 arranged in parallel; a base 12 for integrally securing the base ends of the pair of vibration arms 10, 11; the excitation electrodes 13, formed on the outer surface of the pair of vibration arms 10, 11, for causing the pair of vibration arms 10, 11 to vibrate; and the mount electrodes 14 electrically connected to the excitation electrodes 13. Also, the piezoelectric vibration piece 4 of the embodiment includes grooves 15 formed on the main surfaces of the pair of vibration arms 10, 11 along the longitudinal direction of the vibration arms 10, 11. The grooves 15 are formed from the base ends side to around the midpoints of the vibration arms 10, 11.

The excitation electrodes 13 are electrodes for causing the pair of vibration arms 10, 11 to vibrate at a predetermined resonance frequency in the direction such that the vibration arms 10, 11 get close to or away from each other, formed by patterning, electrically separated from each other, on the outer surface of the pair of vibration arms 10, 11. Specifically, as shown in FIG. 8, one of the excitation electrodes 13 is generally formed on one of the grooves 15 of one vibration arm 10 and on both sides of the other vibration arm 11, and the other of the excitation electrodes 13 is generally formed on both sides of the one vibration arm 10 and on the other of the grooves 15 of the other vibration arm 11.

Also, as shown in FIGS. 6 and 7, the excitation electrodes 13 are electrically connected to the mount electrodes 14 through the pull-out electrodes 16 on the main surfaces of the base 12. Through the mount electrodes 14, a voltage is applied to the piezoelectric vibration piece 4. Note that the above-described excitation electrodes 13, mount electrodes 14 and pull-out electrodes 16 are formed by coating, for example, a conductive film of chrome (Cr), nickel (Ni), aluminum (Al), titanium (Ti) or the like.

Also, the pair of vibration arms 10, 11 has tips coated with the weight metallic films 17 to adjust their vibration states (perform frequency adjustment) so that they vibrate within a predetermined range of frequencies. Note that the weight metallic films 17 are divided into coarse adjustment films 17a for coarsely adjusting the frequency and fine adjustment films 17b for finely adjusting the frequency. Using the coarse adjustment films 17a and the fine adjustment films 17b to adjust the frequency allows the frequency of the pair of vibration arms 10, 11 to be within the range of nominal frequencies of the device.

Figure 2:
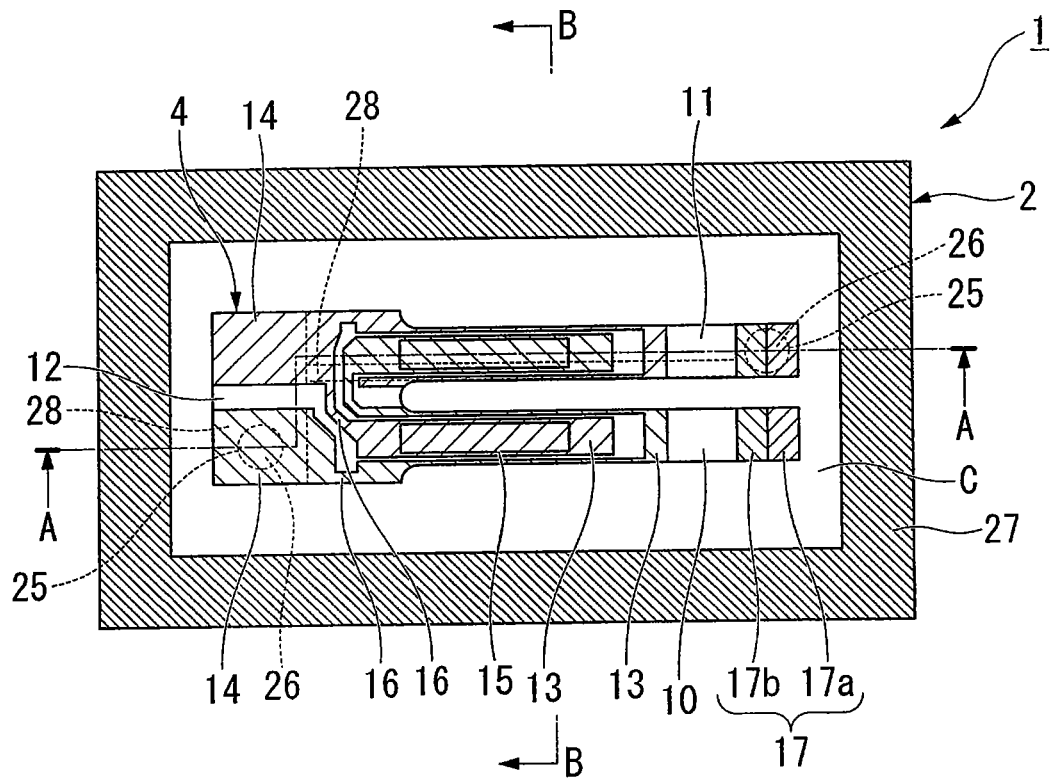
FIG. 2 shows an internal structure of the piezoelectric vibrator shown in FIG. 1, which is a top view of the piezoelectric vibrator with a lid substrate removed.
Figure 3:
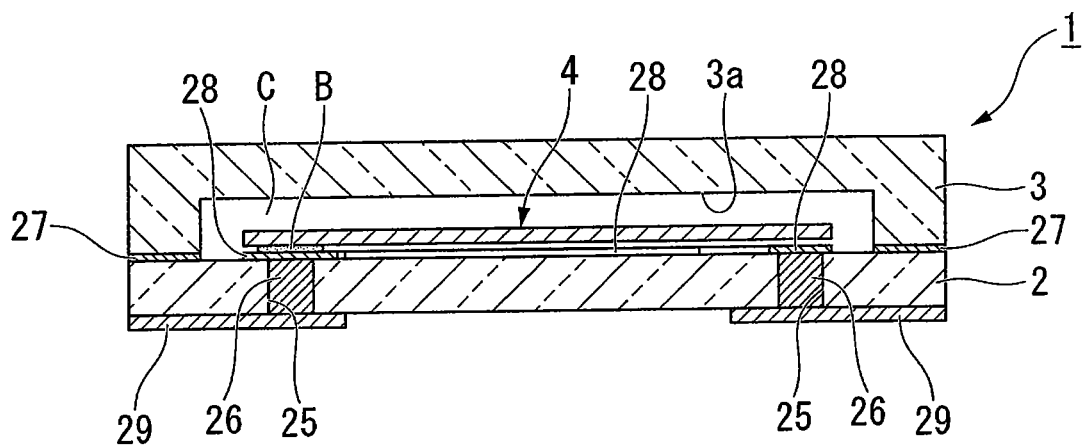
FIG. 3 is a cross-sectional view of the piezoelectric vibrator along the line A-A in FIG. 2.
Figure 4:
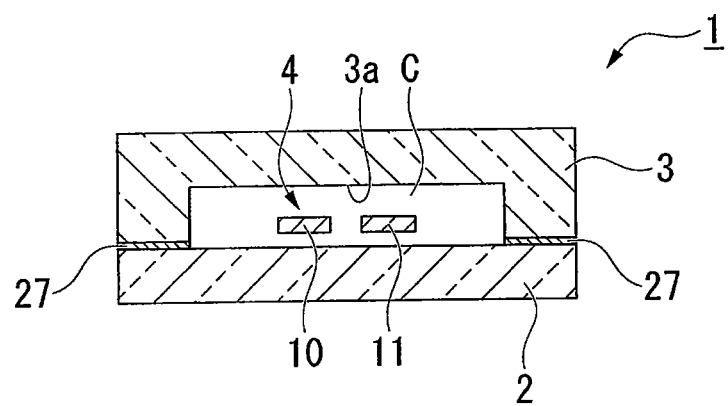
FIG. 4 is a cross-sectional view of the piezoelectric vibrator along the line B-B in FIG. 2.
Figure 5:
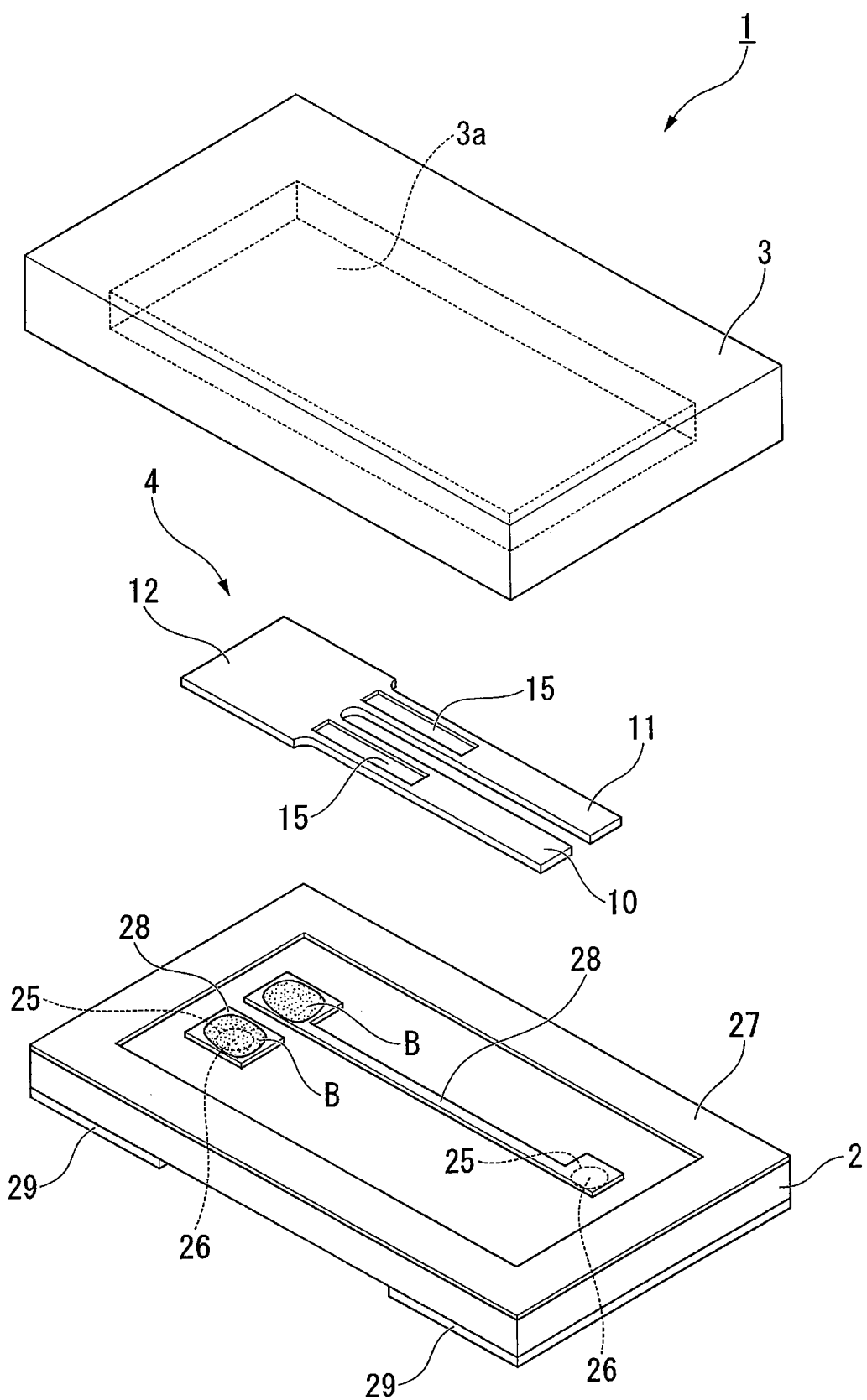
FIG. 5 is an exploded perspective view of the piezoelectric vibrator shown in FIG. 1.

The piezoelectric vibration piece 4 configured in this way is bump-bonded to the top surface of the base substrate 2 using bumps B, such as gold, as shown in FIGS. 2, 3 and 5. More specifically, the pair of mount electrodes 14 is in contact with and bump-bonded to the two bumps B formed on routing electrodes 28 (described later). In this way, the piezoelectric vibration piece 4 is supported to float with respect to the top surface of the base substrate 2, and the mount electrodes 14 are electrically connected to the routing electrodes 28.

The lid substrate 3 is a clear insulating substrate made of a glass material (e.g., soda-lime glass) and shaped in a plate as shown in FIGS. 1, 3, 4 and 5. On the bonding surface of the lid substrate 3 to which the base substrate 2 is bonded, a concave portion 3a rectangular in plan view is formed to contain the piezoelectric vibration piece 4. The concave portion 3a forms a cavity C to contain the piezoelectric vibration piece 4 when the substrates 2 and 3 are stacked on each other. Then, the concave portion 3a is enclosed with the base substrate 2 through the anodic bonding of the lid substrate 3 and the base substrate 2.

The base substrate 2 is a clear insulating substrate made of a glass material (e.g., soda-lime glass) as with the lid substrate 3, and shaped in a plate with a size such that the base substrate 2 can be stacked on the lid substrate 3 as shown in FIGS. 1 to 5. In the base substrate 2, a pair of through holes 25 is formed through the base substrate 2. The pair of through holes 25 is formed to be contained in the cavity C. More specifically, the pair of through holes 25 is formed such that one of the through holes 25 is located on the side of the base 12 of the mounted piezoelectric vibration piece 4, and the other of the through holes 25 is located on the side of the tips of the vibration arms 10, 11.

In the shown example, the through holes 25 have a constant internal diameter throughout the board thickness direction of the base substrate 2. However, the through holes 25 are not limited to this example. For example, the through holes 25 may be formed in a tapered shape with an internal diameter that gradually decreases or increases along the board thickness direction. Anyway, the through holes 25 have only to pass through the base substrate 2.

The pair of through holes 25 has respective through electrodes 26 buried therein. The through electrodes 26 completely fill the through holes 25 to maintain the airtightness in the cavity C and electrically conductively connect external electrodes 29 (described later) and the routing electrodes 28. On the bonding surface of the base substrate 2 to which the lid substrate 3 is bonded, a bonding film 27 for anodic bonding and the pair of routing electrodes 28 are patterned with a conductive material of, for example, aluminum or the like. The bonding film 27 is placed almost throughout an area of the bonding surface of the lid substrate 3 in which the concave portion 3a is not formed, to surround the concave portion 3a.

The pair of routing electrodes 28 is patterned so that one of the through electrodes 26 is electrically connected to one of the mount electrodes 14 of the piezoelectric vibration piece 4, and the other of the through electrodes 26 is electrically connected to the other of the mount electrodes 14 of the piezoelectric vibration piece 4. More specifically, as shown in FIGS. 2 and 5, the one of the routing electrodes 28 is formed directly above the one of the through electrodes 26 to be located directly below the base 12 of the piezoelectric vibration piece 4. The other of the routing electrodes 28 is formed to be routed from a location adjacent the one of the routing electrodes 28 toward the tip of the vibration arm 11 along the vibration arm 11 and then located directly above the other of the through electrodes 26.

On the pair of routing electrodes 28, the bump B are formed on which the piezoelectric vibration piece 4 is mounted. In this way, the one of the mount electrodes 14 of the piezoelectric vibration piece 4 is electrically conductively connected to the one of the through electrodes 26 through the one of the pair of routing electrodes 28, and the other of the mount electrodes 14 is electrically conductively connected to the other of the through electrodes 26 through the other of the pair of routing electrodes 28.

Also, as shown in FIGS. 1, 3 and 5, on the surface opposite the bonding surface of the base substrate 2, the external electrodes 29 are formed to be electrically connected to the pair of through electrodes 26. Specifically, one of the external electrodes 29 is electrically connected to the one of the excitation electrodes 13 of the piezoelectric vibration piece 4 through the one of the through electrodes 26 and the one of the routing electrodes 28. Also, the other of the external electrodes 29 is electrically connected to the other of the excitation electrodes 13 of the piezoelectric vibration piece 4 through the other of the through electrodes 26 and the other of the routing electrodes 28.

In order to activate the piezoelectric vibrator 1 configured in this way, a predetermined drive voltage is applied between the external electrodes 29 formed on the base substrate 2. This can cause a current to flow in the excitation electrodes 13 of the piezoelectric vibration piece 4 and can cause the pair of vibration arms 10, 11 to vibrate at a predetermined frequency in the direction such that the vibration arms 10, 11 get close to or away from each other. Then, the vibration of the pair of vibration arms 10, 11 can be used for a time source, timing source for control signal, reference signal source or the like.

Next, a method for manufacturing a plurality of the above-described piezoelectric vibrators 1 at a time using a base substrate wafer 40 and a lid substrate wafer 50 is described with reference to a flowchart shown in FIG. 9.

First, a piezoelectric vibration piece fabrication step (S10) is performed in which the piezoelectric vibration pieces 4 shown in FIGS. 6 to 8 is fabricated.

Specifically, first, a Lambert raw stone of quartz is sliced at a predetermined angle into a wafer having a uniform thickness. Next, the wafer is roughly processed by lapping, then an affected layer is removed by etching, and then mirror grinding processing, such as polishing, is performed to obtain a wafer with a predetermined thickness. Next, the wafer is subjected to an appropriate treatment, such as cleaning, then the wafer is patterned to form an outer shape of the piezoelectric vibration pieces 4 using photolithography, and a metallic film is formed and patterned to form the excitation electrodes 13, the pull-out electrodes 16, the mount electrodes 14 and the weight metallic films 17. This enables a plurality of the piezoelectric vibration pieces 4 to be fabricated.

Also, after the piezoelectric vibration pieces 4 are fabricated, the resonance frequency is coarsely adjusted. This can be done by irradiating the coarse adjustment films 17a of the weight metallic films 17 with a laser light to cause some of the coarse adjustment films 17a to be evaporated, thereby changing their weight. In this way, the resonance frequency can be adjusted to within the range slightly wider than the range of a target nominal frequency. Note that the fine adjustment to more finely adjust the resonance frequency finally to within the range of the nominal frequency will be performed after the mounting. This will be described later.

Next, a first wafer fabrication step (S20) is performed in which the lid substrate wafer 50 (to be the lid substrate 3 later) is fabricated to the state just before anodic bonding.

Figure 10:
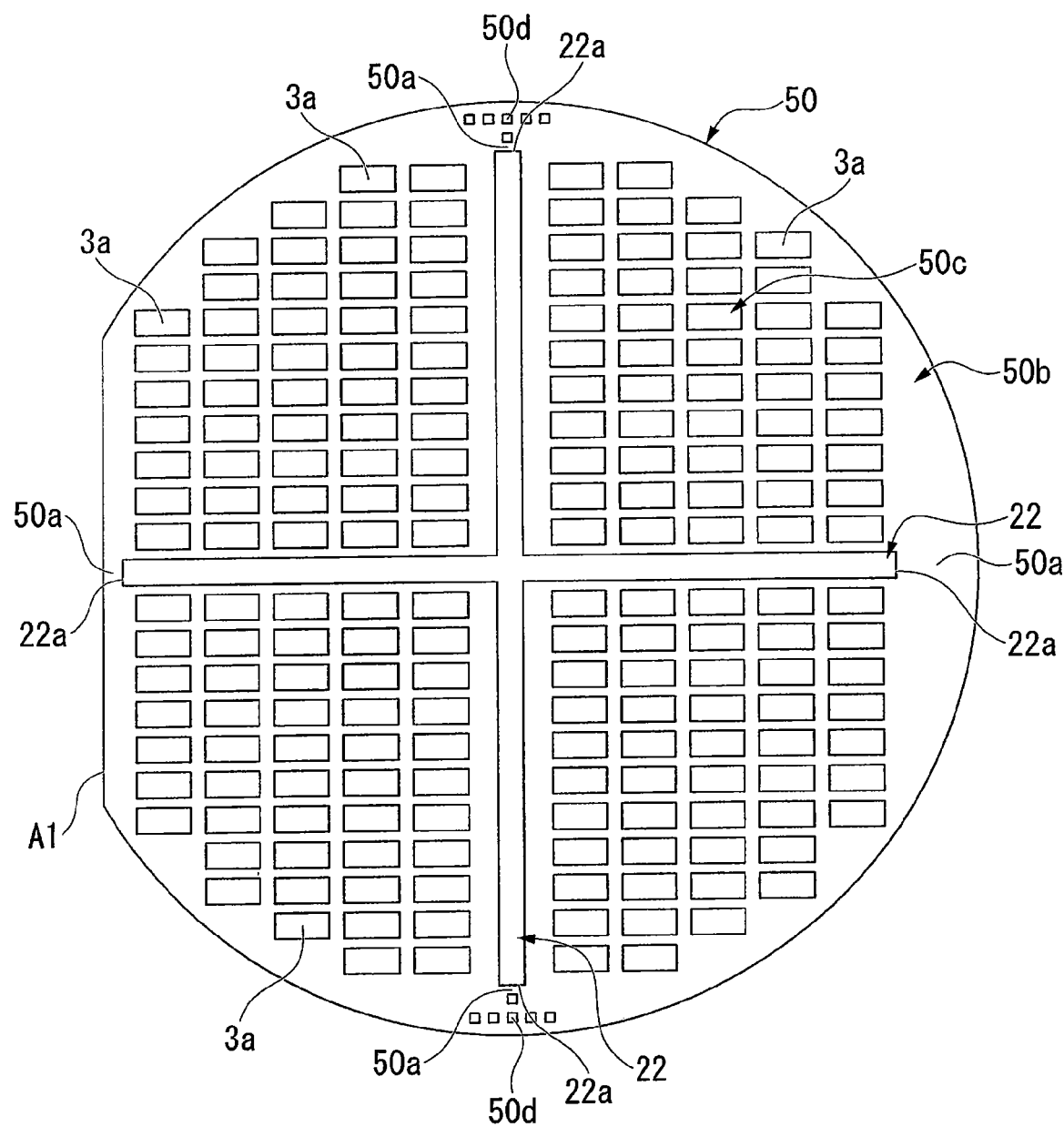
FIG. 10 shows a step in which the piezoelectric vibrator is manufactured according to the flowchart shown in FIG. 9, which shows an embodiment in which concave portions are formed in a lid substrate wafer from which a lid substrate is made.

First, a soda-lime glass is polished to a predetermined thickness and cleaned, then an affected layer on the outermost surface is removed by etching or the like to form the disk-shaped lid substrate wafer 50 as shown in FIG. 10 (S21). In the shown example, the lid substrate wafer 50 is formed circular in plan view, and a reference mark portion A1 is formed by cutting the outer circumference portion of the wafer 50 along the line (chord) connecting two points on the outer circumference.

Next, on the bonding surface of the lid substrate wafer 50, a concave portion formation step (S22) of forming a plurality of the concave portions 3a for the cavities C and a groove formation step (S23) of forming grooves 22 are performed.

The concave portions 3a are formed on the bonding surface of the lid substrate wafer 50 in a portion 50c (hereinafter referred to as "product area") located inward in radial direction with respect to an outer circumference portion 50b. Note that, in the product area 50c, a plurality of the concave portions 3a are formed spaced in one direction, and also formed spaced in another direction orthogonal to the one direction. Also, in the shown example, the concave portions 3a are formed almost throughout the bonding surface of the lid substrate wafer 50 except the outer circumference portion 50b.

On the bonding surface of the lid substrate wafer 50, the grooves 22 extend from the central portion in radial direction to the outside in radial direction and reach the outside of the product area 50c, i.e., the outer circumference portion 50b. In this embodiment, a plurality of the grooves 22 are formed around the center of the lid substrate wafer 50 at regular interval so as to extend radially on the bonding surface of the wafer 50. Also, the grooves 22 have outer edges in radial direction 22a located inward in radial direction with respect to the outer circumference of the lid substrate wafer 50. Further, the grooves 22 have a width less than or equal to the longitudinal length of each of the concave portions 3a formed rectangular in plan view.

Here, in the outer circumference portion 50b of the lid substrate wafer 50, positioning holes 50d into which the positioning pins of the anodic bonding apparatus 30 (described later) are inserted are formed at locations opposite to each other with the center of the wafer 50 in between in radial direction.

In this case, the concave portions 3a and the grooves 22 may be formed at a time by etching the lid substrate wafer 50. Also, the concave portions 3a and the grooves 22 may be formed at a time by pressing the lid substrate wafer 50 from top and bottom while heating it, using a jig. Also, the concave portions 3a and the grooves 22 may be formed at a time by screen-printing a glass paste on an appropriate place on the lid substrate wafer 50. Any of these methods may be used.

At this point, the first wafer fabrication step is completed.

Next, at the same timing as (or at around the timing of) the above steps, a second wafer fabrication step (S30) is performed in which the base substrate wafer 40 (to be the base substrate 2 later) is fabricated to the state just before anodic bonding.

Figure 13:
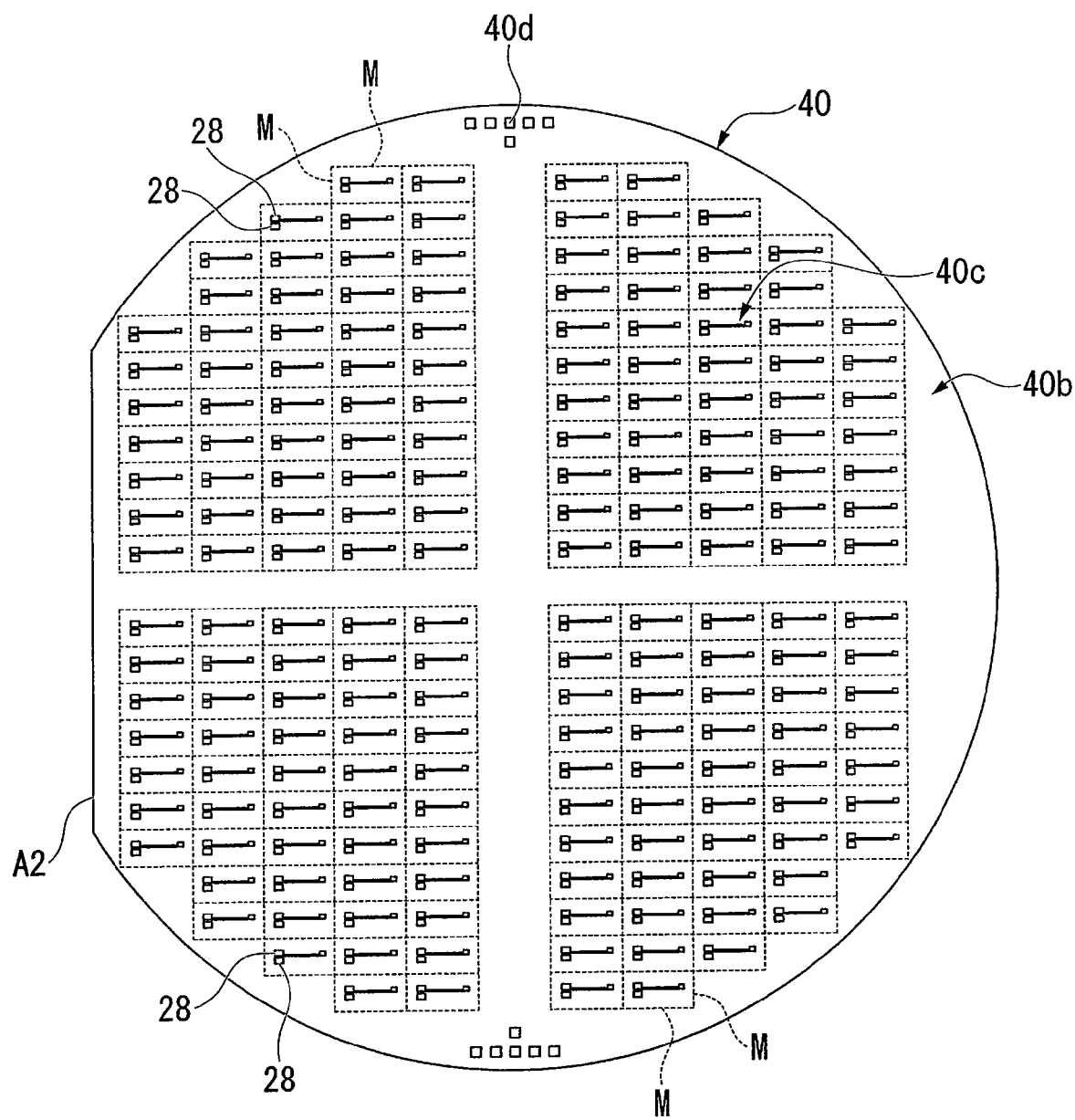
FIG. 13 shows an overall view of the base substrate wafer in the state shown in FIG. 12.

First, a soda-lime glass is polished to a predetermined thickness and cleaned, then an affected layer on the outermost surface is removed by etching or the like to form the disk-shaped base substrate wafer 40 (S31). As shown in FIG. 13, the base substrate wafer 40 is formed circular in plan view, and a reference mark portion A2 is formed by cutting the outer circumference portion of the wafer 40 along the line (chord) connecting two points on the outer circumference. Also, in an outer circumference portion 40b of the base substrate wafer 40, positioning holes 40d into which the positioning pins of the anodic bonding apparatus 30 (described later) are inserted are formed at locations opposite to each other with the center of the wafer 40 in between in radial direction.

Figure 11:
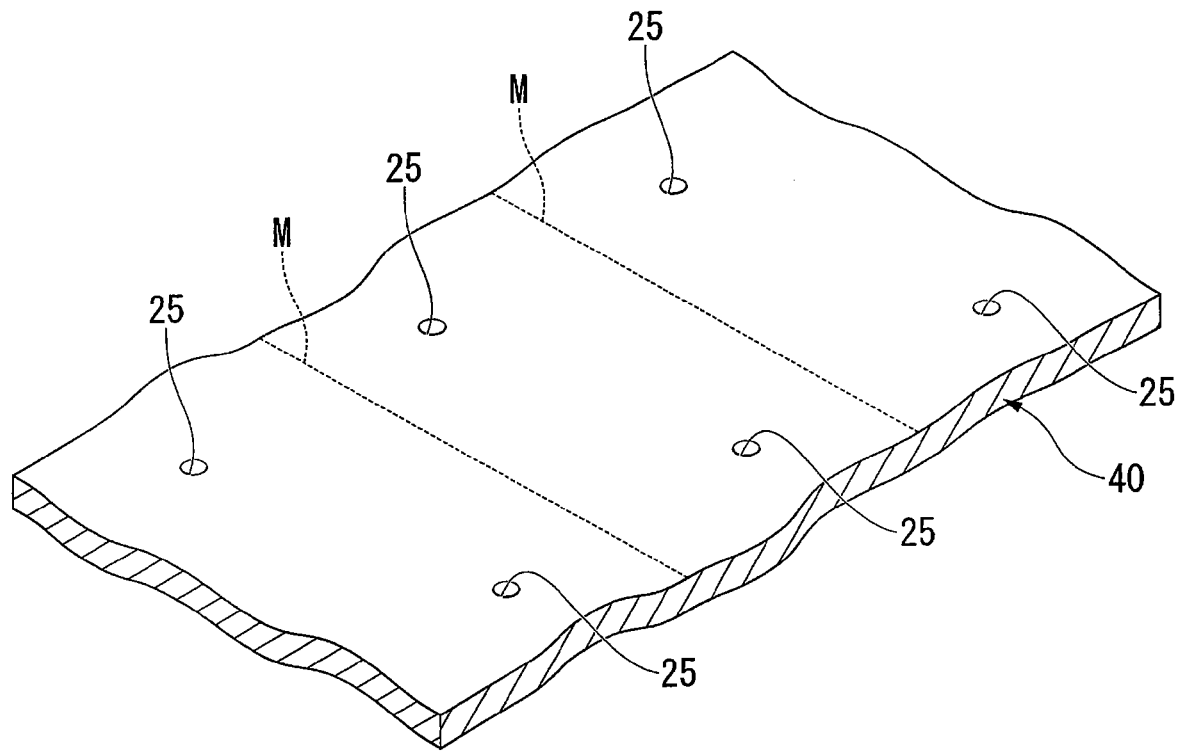
FIG. 11 shows a step in which the piezoelectric vibrator is manufactured according to the flowchart shown in FIG. 9, which shows a state in which pairs of through holes are formed in a base substrate wafer from which a base substrate is made.

Next, a through hole formation step (S32) is performed in which a plurality of the pairs of through holes 25 passing through the base substrate wafer 40 are formed as shown in FIG. 11.

Note that dotted lines M shown in FIG. 11 indicate cutting lines for cutting the wafer in a cutting step to be performed later. The through holes 25 are formed by, for example, sand-blasting, pressing using a jig or the like.

Here, the pairs of through holes 25 are formed such that each of the pairs of through holes 25 is contained in each of the concave portions 3a formed in the lid substrate wafer 50 when the wafers 40 and 50 are stacked on each other, and also, one of the each pair of through holes 25 is placed on the side of the base 12 of the piezoelectric vibration piece 4 to be mounted later and the other of the each pair of through holes 25 is placed on the side of the tip of each of the vibration arms 11. In the shown example, the pairs of through holes 25 are formed on the bonding surface of the base substrate wafer 40 in a portion 40c (hereinafter referred to as "product area") located inward in radial direction with respect to the outer circumference portion 40b. Note that, in the product area 40c, a plurality of the pairs of through holes 25 are formed spaced in one direction, and also formed spaced in another direction orthogonal to the one direction. Also, in the shown example, the pairs of through holes 25 are formed almost throughout the bonding surface of the base substrate wafer 40 except the outer circumference portion 40b.

Figure 12:
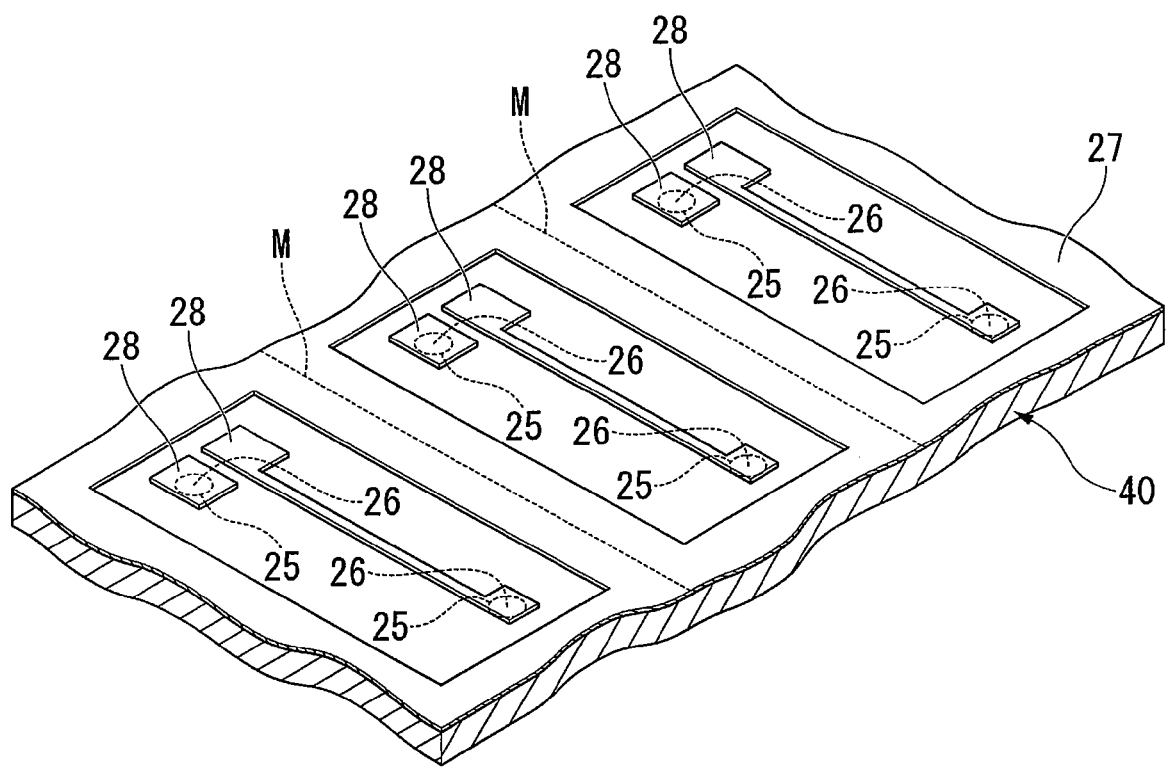
FIG. 12 shows a state in which, after the state shown in FIG. 11, through electrodes are formed in the pairs of through holes, and a bonding film and routing electrodes are patterned on the top surface of the base substrate wafer.

Next, a through electrode formation step (S33) is performed in which the pairs of through holes 25 are filled with a conductive material (not shown) to form the pairs of through electrodes 26. Next, a bonding film formation step (S34) is performed in which the bonding surface of the base substrate wafer 40 are patterned with a conductive material to form the bonding film 27 as shown in FIGS. 12 and 13, and also, a routing electrode formation step (S35) is performed in which a plurality of the pairs of routing electrodes 28 to which the pairs of through electrodes 26 are electrically connected are formed. Thus, ones of the pairs of through electrodes 26 are electrically conductively connected to ones of the pairs of routing electrodes 28, and the others of the pairs of through electrodes 26 are electrically conductively connected to the others of the pairs of routing electrodes 28.

Here, the bonding film 27 is not formed on a portion of the bonding surface of the base substrate wafer 40 on which a portion 50a located in the outer circumference portion 50b of the lid substrate wafer 50 between the outer edges in radial direction 22a of the grooves 22 and the outer circumference of the wafer 50, are stacked.

At this point, the second wafer fabrication step is completed.

Note that dotted lines M shown in FIGS. 12 and 13 indicate cutting lines for cutting the wafer in the cutting step to be performed later. Also note that the bonding film 27 is not shown in FIG. 13.

Figure 9:
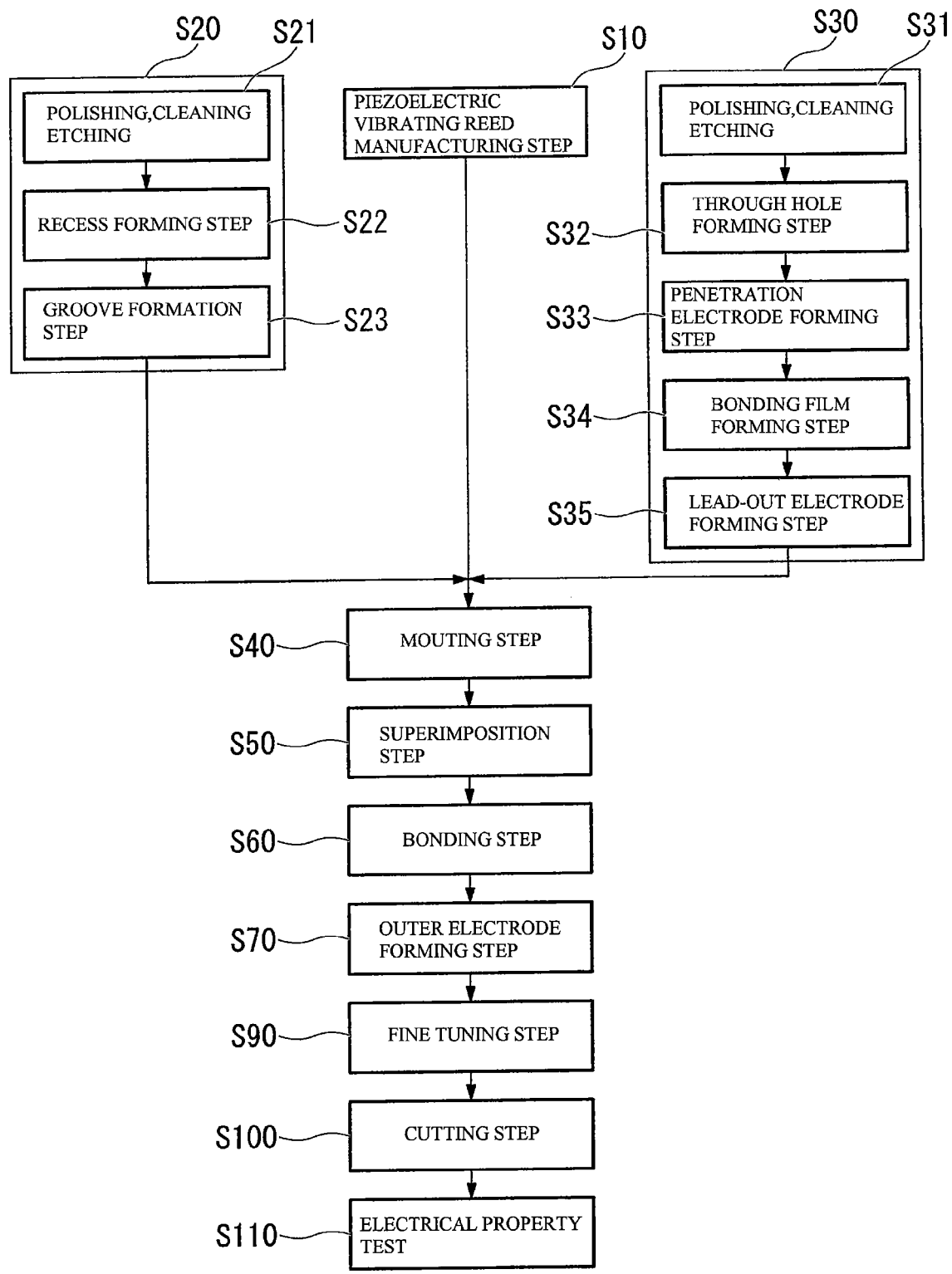
FIG. 9 is a flowchart showing a manufacturing flow of the piezoelectric vibrator shown in FIG. 1.

Although, in FIG. 9, the routing electrode formation step (S35) is performed after the bonding film formation step (S34) is performed, the bonding film formation step (S34) may be performed after the routing electrode formation step (S35) is performed or both of the steps may be performed at a time. The same operational effect can be obtained with any order of the steps. So, the order of the steps may be changed as appropriate.

Next, a mount step (S40) is performed in which the plurality of the fabricated piezoelectric vibration pieces 4 are bump-bonded to the surface of the base substrate wafer 40 through the routing electrodes 28. First, bumps B, such as gold, are formed on the pairs of routing electrodes 28. Then, bases 12 of the piezoelectric vibration pieces 4 are mounted on the bumps B, then the piezoelectric vibration pieces 4 are pressed to the bumps B while the bumps B are being heated to a predetermined temperature. In this way, the piezoelectric vibration pieces 4 are mechanically supported by the bumps B, and electrically connect the mount electrodes 14 and the routing electrodes 28. Accordingly, at this point, the pairs of excitation electrodes 13 of the piezoelectric vibration pieces 4 are electrically conductively connected to the pairs of through electrodes 26. Notably, since the piezoelectric vibration pieces 4 are bump-bonded, they are supported to float with respect to the bonding surface of the base substrate wafer 40.

Next, the base substrate wafer 40 and the lid substrate wafer 50 are set in the anodic bonding apparatus 30.

Figure 14:
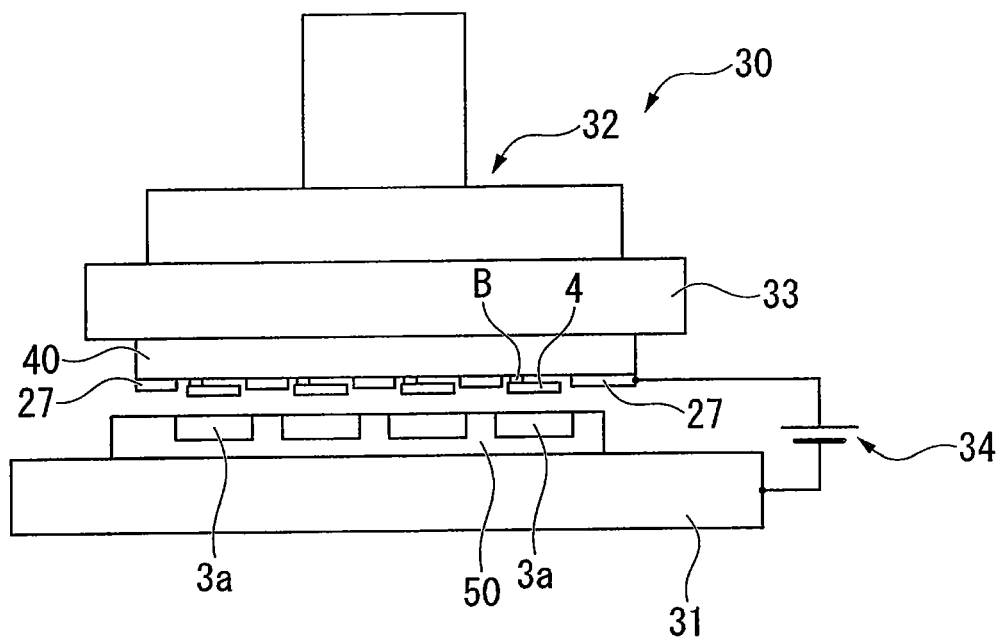
FIG. 14 is a schematic view showing a state in which the base substrate wafer and the lid substrate wafer are set in an anodic bonding apparatus.

Here, as shown in FIG. 14, the anodic bonding apparatus 30 includes: a lower jig 31 formed of a conductive material; an upper jig 33 supported by a pressurizing means 32 so that the upper jig 33 can advance and retreat with respect to the lower jig 31; and a voltage apply means 34 for electrically connecting the bonding film 27 of the base substrate wafer 40 set on the upper jig 33 to the lower jig 31, and is placed in a vacuum chamber (not shown).

Then, the lid substrate wafer 50 is set on the lower jig 31 with the concave portions 3a open to the upper jig 33, and the base substrate wafer 40 is set on the upper jig 33 with the piezoelectric vibration pieces 4 opposite to the concave portions 3a on the lid substrate wafer 50. Note that, at this time, the base substrate wafer 40 and the lid substrate wafer 50 are positioned along the respective surface directions with the reference mark portions A1 and A2 formed on the base substrate wafer 40 and the lid substrate wafer 50, respectively, used as a reference, and by inserting the positioning pins (not shown) provided on the anodic bonding apparatus 30 into the positioning holes 40d and 50d formed in the wafers 40 and 50.

Then, a stacking step (S50) is performed in which the pressurizing means 32 is driven to advance the upper jig 33 toward the lower jig 31, thereby causing the piezoelectric vibration pieces 4 of the base substrate wafer 40 to go into the concave portions 3a of the lid substrate wafer 50 to stack the wafers 40 and 50. In this way, the piezoelectric vibration pieces 4 mounted on the base substrate wafer 40 are contained in the cavities C formed between the wafers 40 and 50.

Next, a bonding step (S60) is performed in which, under a predetermined temperature, a predetermined voltage is applied to perform anodic bonding. Specifically, a predetermined voltage is applied between the bonding film 27 of the base substrate wafer 40 and the lower jig 31 by the voltage apply means 34. This causes an electrochemical reaction in the interface between the bonding film 27 and the bonding surface of the lid substrate wafer 50, causing them to be strongly and tightly adhered and anodically bonded to each other. In this way, the piezoelectric vibration pieces 4 can be sealed in the cavities C, and a bonded wafer body 60 (shown in FIG. 15) can be obtained in which the base substrate wafer 40 is bonded to the lid substrate wafer 50.

In this case, the portion 50a located in the outer circumference portion 50b of the lid substrate wafer 50 between the outer edges in radial direction 22a of the grooves 22 and the outer circumference of the wafer 50 remains not bonded to the outer circumference portion 40b of the base substrate wafer 40.

Figure 15:
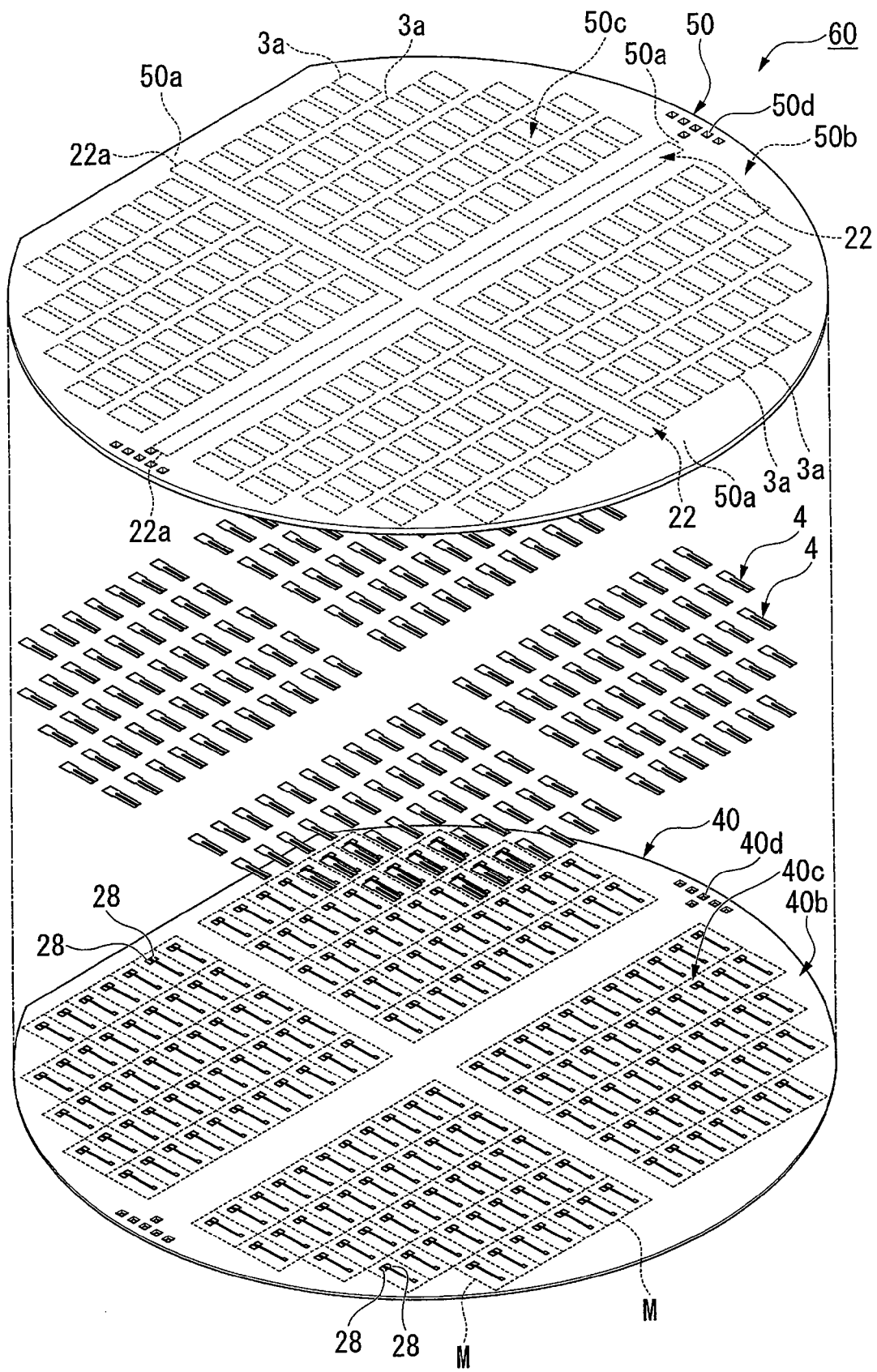
FIG. 15 shows a step in which the piezoelectric vibrator is manufactured according to the flowchart shown in FIG. 9, which is an exploded perspective view of a bonded wafer body in which the base substrate wafer and the lid substrate wafer are anodically bonded to each other with the piezoelectric vibration pieces contained in the cavities.

Note that, in FIG. 15, for viewability, the bonded wafer body 60 is shown in exploded view and the bonding film 27 of the base substrate wafer 40 is not shown. Also, dotted lines M shown in FIG. 15 indicate cutting lines for cutting the wafer in the cutting step to be performed later.

By the way, in performing anodic bonding, since the through holes 25 formed in the base substrate wafer 40 are completely filled with the through electrodes 26, the airtightness in the cavities C is not impaired by the through holes 25.

Then, after the above-described anodic bonding is completed, an external electrode formation step (S70) is performed in which the surface opposite the bonding surface of the base substrate wafer 40 to which the lid substrate wafer 50 is bonded is patterned with a conductive material to form a plurality of the pairs of external electrodes 29 electrically connected to the pairs of through electrodes 26. This step enables the piezoelectric vibration pieces 4 sealed in the cavities C to be activated using the external electrodes 29.

Next, in the form of the bonded wafer body 60, a fine adjustment step (S90) is performed in which the frequency of the individual piezoelectric vibration pieces 4 sealed in the cavities C is finely adjusted to within a predetermined range. Specifically, a voltage is applied between the pairs of external electrodes 29 to cause the piezoelectric vibration pieces 4 to vibrate. Then, while the frequency is being measured, a laser light is applied from the outside through the lid substrate wafer 50 to cause the fine adjustment films 17b of the weight metallic films 17 to be evaporated. This changes the weight of the tip sides of the pairs of vibration arms 10, 11, which allows the frequency of the piezoelectric vibration pieces 4 to be finely adjusted to within a predetermined range of the nominal frequency.

After the frequency fine adjustment is completed, the cutting step (S100) is performed in which the bonded wafer body 60 is cut along the cutting lines M (shown in FIG. 15) into small pieces. Consequently, a plurality of the surface mount piezoelectric vibrators 1 (shown in FIG. 1) can be manufactured at a time in which the piezoelectric vibration pieces 4 are sealed in the cavities C formed between the base substrates 2 and the lid substrates 3 anodically bonded to each other.

Note that the fine adjustment step (S90) may be performed after the bonded wafer body 60 is cut into the small pieces (individual piezoelectric vibrators 1) in the cutting step (S100). However, as described above, if the fine adjustment step (S90) is performed earlier, the fine adjustment can be performed in the form of the bonded wafer body 60, allowing more efficient fine adjustment of the plurality of the piezoelectric vibrators 1. This order of the steps is more preferable because the throughput can be improved.

Next, an electrical characteristics inspection (S110) is performed on the inside of the piezoelectric vibrators 1. Specifically, the resonance frequency, resonant resistance value, drive level characteristics (excitation power dependency of resonance frequency and resonant resistance value) and the like of the piezoelectric vibration pieces 4 are measured and checked. In addition, the insulation resistance characteristic and the like are checked. Finally, an appearance inspection is performed on the piezoelectric vibrators 1 in which their dimension, quality and the like are finally checked. This is the end of manufacturing the piezoelectric vibrators 1.

As described above, according to the method for manufacturing the piezoelectric vibrators 1 in accordance with this embodiment, the grooves 22 are formed in the lid substrate wafer 50, which can facilitate discharging oxygen gas generated between the wafers 40 and 50 when the wafers 40 and 50 are bonded, from between the wafers 40 and 50 to the outside through the grooves 22, inhibiting the formation of a piezoelectric vibrator 1 having a low vacuum in the cavity C.

Furthermore, since the grooves 22 are formed in the lid substrate wafer 50 including the concave portions 3a, the grooves 22 can be formed together when the concave portions 3a are formed by, for example, pressing or etching, improving the efficiency of forming the wafer 50.

Furthermore, since the outer edges in radial direction 22a of the grooves 22 are located inward in radial direction with respect to the outer circumference of the lid substrate wafer 50, the reduction in strength of the wafer 50 due to forming the groove 22 in the wafer 50 can be inhibited, preventing the handling quality of the wafer 50 from deteriorating.

Furthermore, in this embodiment, since the portion 50a located in the outer circumference portion 50b of the lid substrate wafer 50 between the outer edges in radial direction 22a of the grooves 22 and the outer circumference of the wafer 50 is not bonded to the outer circumference portion 40b of the base substrate wafer 40, the oxygen gas in the grooves 22 can be reliably discharged from between the wafers 40 and 50 to the outside through the small gap between the portion 50a and the outer circumference portion 40b.

Furthermore, in this embodiment, the grooves 22 are arranged radially on the bonding surface of the lid substrate wafer 50, the oxygen gas generated between the wafers 40 and 50 in bonding can be reliably discharged from between the wafers 40 and 50 to the outside.

Furthermore, in this embodiment, the width of the grooves 22 less than or equal to the longitudinal length of each of the concave portions 3a formed rectangular in plan view facilitates ensuring the wide product area 50c in which the concave portions 3a can be formed on the lid substrate wafer 50, which can increase the number of the piezoelectric vibrators 1 that can be formed at a time, i.e., improve yields.

Note that the technical scope of the invention is not limited to the above embodiment, and various changes can be made to the embodiment without departing from the spirit of the invention.

Although the grooves 22 are formed in the lid substrate wafer 50 in the above embodiment, the grooves 22 may also be formed in the base substrate wafer 40.

Although, in the above embodiment, the portion 50*a* located in the outer circumference portion 50*b* of the lid substrate wafer 50 between the outer edges in radial direction 22*a* of the grooves 22 and the outer circumference of the wafer 50 is not bonded to the outer circumference portion 40*b* of the base substrate wafer 40, the portion 50*a* may be bonded to the outer circumference portion 40*b*.

Although, in the above embodiment, the outer edges in radial direction 22*a* of the grooves 22 are located inward in radial direction with respect to the outer circumference of the lid substrate wafer 50, the outer edges in radial direction 22*a* of the grooves 22 may reach the outer circumference of the lid substrate wafer 50.

Further, through slits may be formed in place of the grooves 22 shown in the above embodiment, for example.

Although, in the above embodiment, the piezoelectric vibration piece 4 is bump-bonded, the way of bonding the piezoelectric vibration piece 4 is not limited to bump-bonding. For example, the piezoelectric vibration piece 4 may be bonded with an electrically conductive adhesive. However, bump-bonding enables the piezoelectric vibration piece 4 to float with respect to the surface of the base substrate 2, automatically ensuring a minimum vibration gap necessary for vibration. In this regard, bump-bonding is preferable.

Although, in the above embodiment, the piezoelectric vibrator 1 is shown as an example of the package product, the package product is not limited to this and may be another one as appropriate, for example.

Further, without departing from the spirit of the invention, any of the components in the above embodiment may be replaced with a known component as appropriate and the above variations may be combined as appropriate.

The oxygen gas generated between the two wafers when the wafers are bonded can be facilitated to be discharged to the outside.

What is claimed is:

1. A stacked wafer assembly including a first wafer anodically bonded to a second wafer and defining a plurality of package products each having a cavity enclosing an operation piece, the assembly comprising:
    a product area in the first wafer including a plurality of concave portions each comprising a portion of the cavity in the stacked wafer assembly, the product area having an outer perimeter with respect to a geometric center of the first wafer; and
    the first wafer further including grooves or slits extending from a proximal portion at the geometric center of the first wafer in a radial direction toward a perimeter of the first wafer, the grooves or slits extending beyond the outer perimeter of the product area to a distal terminal portion located proximal to the perimeter of the first wafer.

2. A package product manufacturing method of stacking and anodically bonding first and second wafers to each other to form a plurality of package products each having a cavity in which an operation piece is contained therein, wherein the wafer is arranged according to the first wafer of claim 1.

* * * * *